United States Patent [19]

Smith et al.

[11] 4,438,880
[45] Mar. 27, 1984

[54] ULTRASONIC WIRE BOND TOUCHDOWN SENSOR

[75] Inventors: Michael C. Smith; Hal W. Smith, Jr., both of Costa Mesa, Calif.

[73] Assignee: Orthodyne Electronics Corporation, Costa Mesa, Calif.

[21] Appl. No.: 293,303

[22] Filed: Aug. 17, 1981

[51] Int. Cl.³ .............................................. B23K 1/06
[52] U.S. Cl. .................................... 228/1 A; 228/110
[58] Field of Search .................... 228/10, 9, 1 R, 110, 228/1; 219/124.34, 137.42; 156/73.1, 580.1

[56] References Cited

U.S. PATENT DOCUMENTS

| | | | |
|---|---|---|---|
| 3,305,157 | 2/1967 | Pennings | 228/1 |
| 3,328,875 | 4/1967 | Pennings | 228/1 |
| 3,763,545 | 10/1973 | Spanjer | 228/103 |
| 3,794,236 | 2/1974 | Salzer et al. | 228/1 |
| 3,848,792 | 11/1974 | Mims | 228/1 |
| 3,954,217 | 5/1976 | Smith | 228/1 |
| 3,955,740 | 5/1976 | Shoh | 228/1 |
| 4,341,574 | 7/1982 | Landes | 228/1 |

*Primary Examiner*—Nicholas P. Godici
*Assistant Examiner*—M. Jordan

*Attorney, Agent, or Firm*—George F. Bethel; Patience K. Bethel

[57] ABSTRACT

The following specification discloses a touchdown sensor for ultrasonic wire bonding devices. Such ultrasonic wire bonding devices are used for purposes of bonding wires to integrated circuits, package terminations, hybrids, and discrete semiconductor devices. The devices entail the utilization of a transducer that operates in a series resonant mode. The means of exciting the resonant mode is through an electrical signal imparted thereto, so that a tool attached to the transducer can then impart an ultrasonic bond to a wire with which it is placed in contact. The tool attached to the transducer is lowered by the device to a discrete location. The point of contact is monitored by sensing an increased impedance by contact of the tool and dampening of the transducer's resonant mode. This increased impedance is read by means of producing a voltage proportional to transducer current and determining when it has decreased below a previously set reference voltage. A comparator then makes a comparison of the reference voltage with respect to the decreased voltage and signals a control microprocessor to stop the device. This is done by preventing a motor from carrying the tool farther after it has made contact with the work.

24 Claims, 3 Drawing Figures

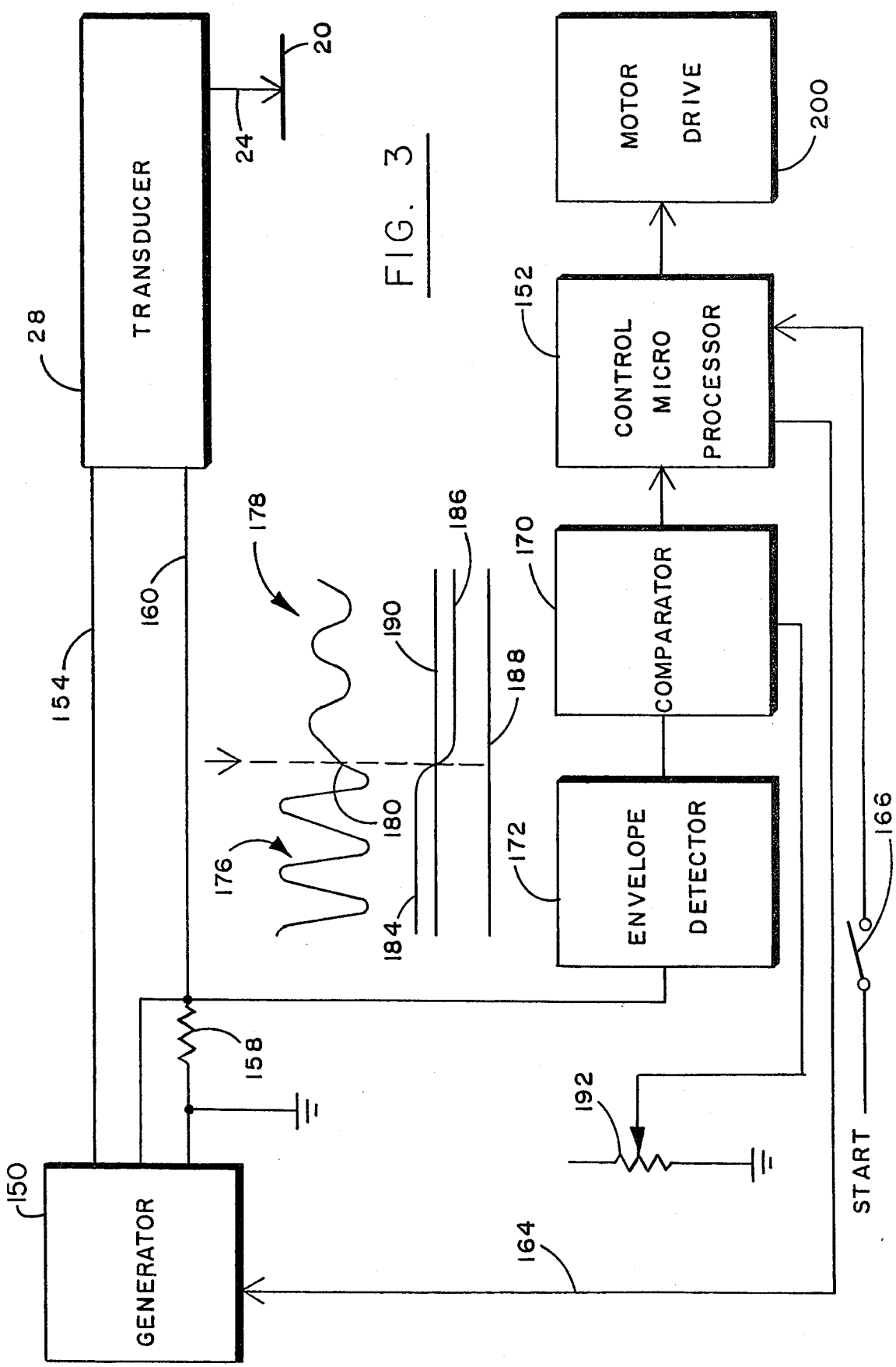

ULTRASONIC WIRE BOND TOUCHDOWN SENSOR

BACKGROUND OF THE INVENTION

1. Field of the Invention

The field of this invention lies within the field of bonding wires and other devices within the electronics art. More particularly, it lies within the ultrasonic bonding art for wire bond applications. It specifically relates to ultrasonic wire bonding and discrete orientation of a wire bonding tool to the work that it is to be bonded to.

2. The Prior Art

Various ultrasonic methods are utilized for welding a wire between a semiconductor device and other circuits or to the terminals of the device itself.

The foregoing welding means can be divided into two types. A first type is a wedge bonding type, while the second type is referred to as ball bonding.

Bonding in general within the framework of this art and this invention is directed to that process that uses a combination of force applied to the two surfaces that are to be welded with an attendant ultrasonic vibration. The ultrasonic vibration assists in forming a true cold weld to bond the two metal items together.

In some cases, a slightly elevated temperature is added to the process. Regardless of this, the temperature is much lower than that used in thermocompression bonding.

Ball bonding requires the user to form a ball on the end of a wire projecting through a ceramic or metal lead hole called a capillary. This is done with a fine hydrogen flame or spark discharge, so that the ball is formed at the end of the wire that is fed through the capillary.

Once the ball is formed, it is brought into contact with the surface to which it is to be welded. This is done by lowering the capillary holding the wire with the ball at the end and the transducer for bonding the device until contact is made with the surface that it is to be bonded to. After contact, a suitable pressure or force is applied to the ball at the end of the wire, holding it against that portion it is to be welded to. Ultrasonic energy is then generated to complete the bond.

Wedge bonding differs from the foregoing ball bonding to the extent that the wire is brought under a tool. No ball is used for bonding. Instead, the wire is simply pressed against the surface and ultrasonic energy is applied by the transducer to flatten the wire. The foregoing action completes the bond.

Although many mechanical differences exist in the various types of bonding tools used for wedge bonding, ball bonding, as well as other types of ultrasonic bonding for wires, there are similar problems in applying either process. One problem that is substantial is to move the interconnect wire to the surface at a high speed, yet not appreciably deform the wire, due to deceleration forces developed when the mass of the transducer is stopped by contact with the work surface. Any flattening of the wire tends to prevent a high quality bond in the flattened region.

To solve the foregoing problem, manufacturers of wire bonding machinery have tended to reduce the velocity of the transducer and bonding head just before touchdown occurs or is expected to occur. However, it is oftentimes not convenient to do this. Furthermore, many of the surfaces to which a bond is to be made may vary in height from semiconductor device to semiconductor device, or within the same device itself.

In some devices, there is a need to attach a wire to a plurality of surfaces at widely varying levels within the device itself. This particular physical problem necessitates frequent readjustment of the bonding machine and slows down production, as well as creating poor bonds.

The foregoing problem can be overcome if the point of touchdown can be sensed. In other words, if at the moment of touchdown, contact is sensed and the transducer and tool is stopped, a significantly improved bond and production can take place.

In order to do this, the transducer must have a low moment of inertia and be driven by a motor that can be stopped quickly. These are readily available in the form of a transducer and a motor that can be stopped (i.e., a DC or stepping motor). However, the remaining portion of the problem was not soluble until this invention.

The invention incorporates an ultrasonic generator and transducer with a carrier signal that is imposed thereon. When the tool and wire make contact, it creates an increase in transducer impedance and lowers the current in the transducer.

Simply stated, the transducer is driven with a sixty KHz constant voltage signal. This is the same signal used for bonding. The impedance change is monitored by measuring the value of the sixty KHz current flowing to the transducer. This current upon contact decreases significantly at the point of touchdown due to dampening.

A voltage comparator circuit monitors the DC level suitable for signalling the motor control circuit to stop the motor. Afterwards, bonding takes place and the unit is then recycled for another touchdown sensing.

As will be seen in the following description of the specification, this invention is a substantial improvement over the prior art by allowing for increased sensitivity at touchdown, preventing poor bonding, while at the same time enabling increased productivity through the elimination of certain adjustments that are required.

SUMMARY OF THE INVENTION

In summation, this invention comprises an ultrasonic wire bonding apparatus or device having an electronic sensing circuit for detecting when the tool or head of the bonder has made contact with the work.

More particularly, the invention comprises an ultrasonic wire bonder that is utilized with a wire bonding device. The wire bonding device is one that is driven upwardly and downwardly by means of a motor or other electromotive means, such as a stepping motor, dc servo or motor. The electromotive means is controlled by pulses or other suitable signals in order to provide small incremental electromotive movement. Such means can be a stepping motor in order to move the head upwardly and downwardly within discrete finite distances.

The discrete movement of the electromotive means or motor can be provided in this embodiment by a series of pulses that drive the motor or servo. The pulses are initiated from a control microprocessor to the motor drive. The control microprocessor effectively controls the motor drive, as well as providing the controls to a generator for the ultrasonic bonding transducer.

To provide touchdown sensing, the control microprocessor receives information from a comparator that compares a particular reference voltage to that of a voltage signal proportional to current through the transducer. The signal is established within certain levels and once it drops below a certain level an envelope detector allows the comparator to trigger the control microprocessor for purposes of stopping the motor drive.

The voltage levels with respect to the reference voltage are specifically directed toward the fact that when the transducer and the tool to which it is attached makes contact, the ultrasonic wave form is diminished and the attendant impedance is increased. This increase in impedance causes the voltage to attendantly drop. Thereafter, the envelope detector determines the fact that the voltage has dropped beyond the reference level and accordingly allows the comparator to directly control the microprocessor to stop the motor drive.

The invention depends upon an increased impedance after the transducer makes contact. At this time the impedance is then detected by making a reading of the decreased voltage and stopping the motor from moving any farther. The foregoing action is based on the fact that the increased impedance which is encountered is fundamentally a factor of the tool or transducer making contact with a dampening element (i.e., the work) which increases impedance.

BRIEF DESCRIPTION OF THE DRAWINGS

The invention will be more clearly understood by reference to the description below taken in conjunction th the accompanying drawings wherein.

DESCRIPTION OF THE PREFERRED EMBODIMENTS

Figure 1:
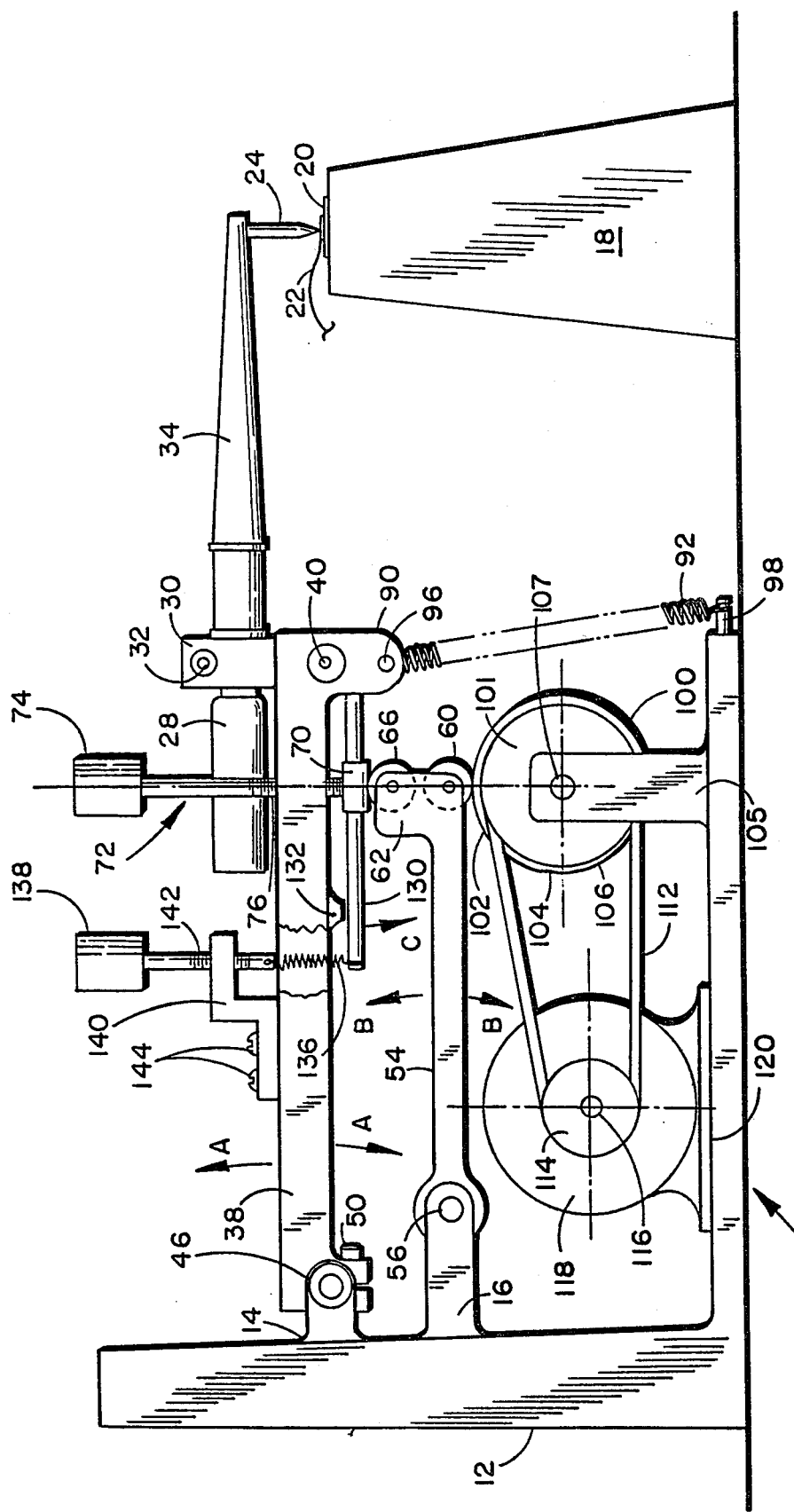
FIG. 1 shows a side elevation schematic view of an ultrasonic bonding device using this invention, that is generally known in the art.
Figure 2:
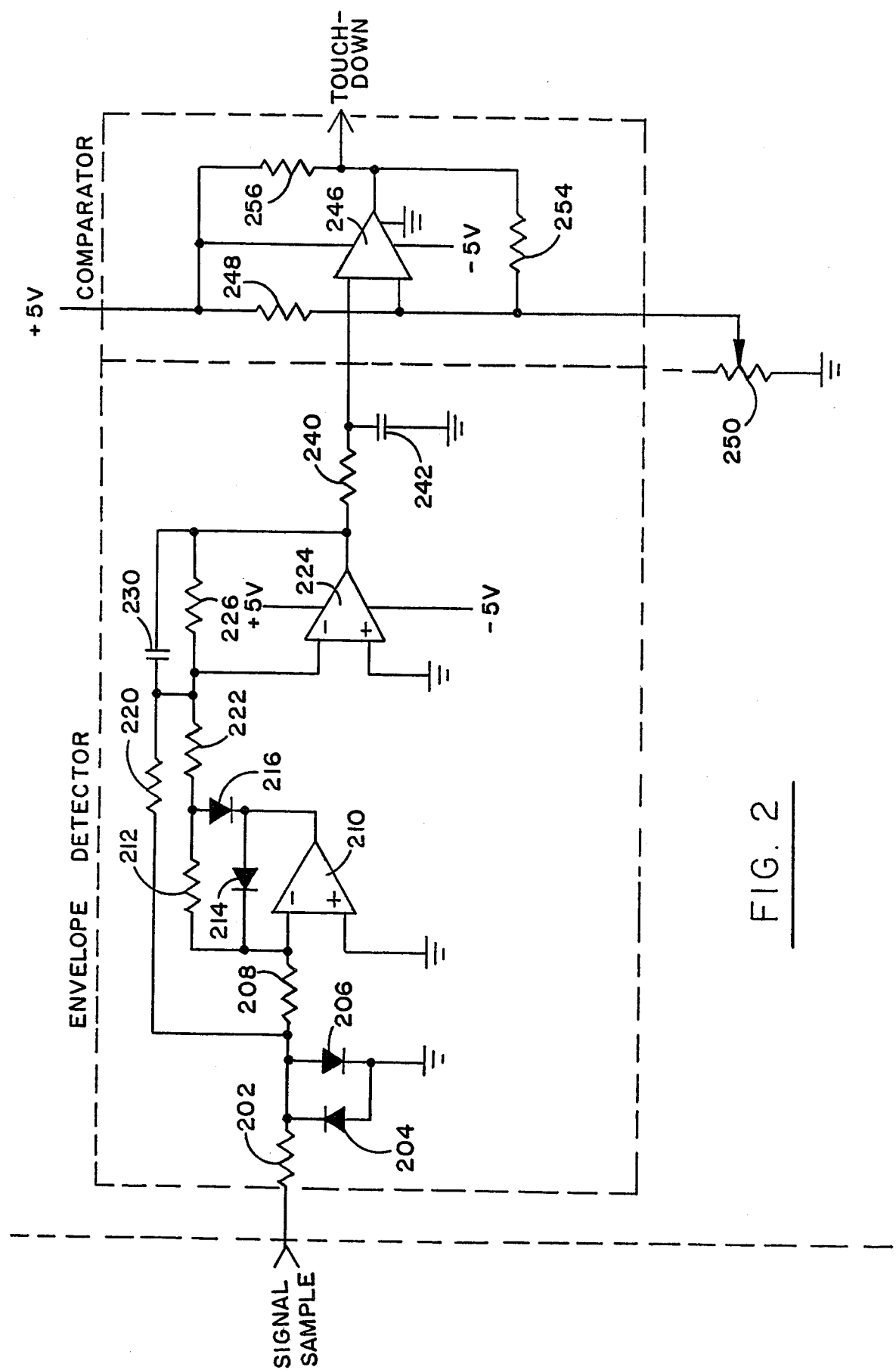
FIG. 2 shows a discrete circuit with the components thereof that provide the comparator functions and envelope detector, as well as other portions, for causing this invention to function; and, FIG. 3 shows a block diagram of the major components of this invention for purposes of showing the respective functions thereof.

Looking more particularly at FIG. 1 which shows the mechanical portions of the invention, it can be seen that a base 10 is shown upon which the device rests. The base 10 supports a bracket or frame member 12 that stands in an upright position and supports the operative elements of this invention in a manner to be described hereinafter.

The base 10 supports an upper bearing support 14 and a lower bearing support 16 by means of the upright bracket or frame 12.

The bearing supports provide pivot points around which the operative elements of the device function, as shall be described hereinafter.

At a portion distal from the base 10 is a stand or pedestal 18. The pedestal 18 supports the work which is to be bonded. The pedestal 18 can be in any suitable configuration, such as the pedestal at an inline operating station, a single pedestal, or other forms, all of which are described in certain catalogs and other literature of the assignee of this invention, namely, Orthodyne Electronics. For purposes of simplification, this device and invention has been shown with a simplified pedestal 18 to illustrate the general problems inherent within the prior art and how this invention solves them.

The pedestal 18 supports the work 20 which has been shown as an integrated circuit with a wire 22 leading therefrom. The wire 22 is to be bonded to the work 20 by means of a tool bonding head or other device which has been exemplified by the tool 24 overlying the work 20.

Looking more particularly at the operative portion of the invention, a transducer 28 has been shown mounted within a transducer mounting 30. The transducer mounting 30 has a screw 32 that has been shown for exemplary purposes as an Allen head screw to hold the transducer and a tool cone 34 extending therefrom. The tool cone 34 fundamentally receives the output of the transducer 28 in the ultrasonic mode and transmits it to the tool 24. This in turn bonds the wire 22 to the work 20. The integrated circuit or work 20 has the wire 22 extending therefrom that can then be attached to another portion thereof or to another electronic component, or handled in any other particular manner desired.

The transducer support mounting 30 is connected to a horizontal H frame 38, or horizontal bracket. The bracket 38 in the plan view generally has an H configuration. However, it can be operative in any particular manner or form so as to provide the pivotal functions and the lowering movement as described hereinafter. The horizontal or H frame 38 is such that it has a transducer pivot 40 around which the transducer mounting moves. This transducer pivot is such that it allows the tool 24 to move upwardly and downwardly with respect to the frame 38 in the manner to be described hereinafter.

The H frame or upper frame 38 is supported at one end by means of bearings 46 that are side loaded in order to provide for sufficient tightness of the mounting of the frame 38. At the same time it provides free pivotal motion upwardly and downwardly in the direction of arrow A. This upward and downward motion in the direction of arrow A is controlled at the pivot point or bearing point 46 which is secured by means of a screw 50 holding the upper arm or frame 38 in the pivotal mode.

The bearing support 16 supports a cam follower arm 54. The cam follower arm 54 is supported by means of a bearing 56, so that it can move upwardly and downwardly in the direction of arrow B—B and arrows A—A. This pivotal movement of the cam follower arm 54 upwardly and downwardly translates into movement of the other frame arm 38 in a manner described hereinafter.

In order to accommodate the movement of the upper frame arm 38, a first cam follower bearing 60 is utilized and mounted within a tab 62 of the cam follower arm 54. The cam follower arm 54 with its upper extended tab or upright 62, carries a second bearing 66 which moves upwardly and downwardly around the axis of the bearing 56 to which the cam follower arm 54 is supported.

The cam follower arm 54 in turn supports a disk 70 that is attached to the end of a screw 72 having a knurled head 74 and threads 76 passing through the upper horizontal H frame or bracket 38. Adjustment of the knurled screw 74 causes the bracket 38 to move upwardly and downwardly with respect to the positioning in which it is held against the cam follower bearing 66.

The upper horizontal H frame or support 38 has a downward tab or depending member 90 to which a spring 92 is attached through means of a pintal 96 passing through the tab 90. At the other end, the spring 92 is attached to a pin 98 extending from the base 10.

The spring 92 serves to pull the H frame or horizontal frame member 38 downwardly against its support means which comprise arm 54, and bearings 66 and 60 attendantly supported on a cam 100. The cam 100 has an outside diameter 102 which decreases at a point 104 to a lesser diameter 106. Thus, the major cam surface 102 allows for a drop of the horizontal H frame 38 as the cam follower bearing 60 moves over the surface of the cam 100 at point 104.

In order to support the cam 100, a cam mounting 105 is shown having a bearing 107 to which the cam is rotatably journalled thereon.

The bearing 107 can either be within the frame member, on the axle attached thereto, or within the cam itself rotating on the axle. Regardless of the foregoing, the cam 100 is formed so as to rotate and drive the cam follower arm 58 upwardly and downwardly.

The cam 100 is driven by a belt 112 attached to a pulley 114. The pulley 114 is in turn connected by means of a shaft 116 to a motor 118. The motor is mounted by means of a motor mount 120 to the frame 10.

The reduction between the motor pulley 114 and the cam 100 with the pulley 101 thereof connected thereto is on a one and a half to one basis.

The motor 118 is a pulsing stepping motor having two hundred pulses per revolution which creates a very finite resolution of the cam surface 104 when it contacts the cam follower bearing 60 providing discrete downward movement of the tool 24 in a very finite manner.

The stepping motor 118 starts and stops with approximately two hundred pulses per revolution, as previously described. This movement, of course, causes the tool 24 to be raised and lowered with respect to the work 20.

In operation, the motor 118 rotates the cam 100 to the point where the decreased cam surface 104 underlies the cam follower bearing 60. This causes the upper cam bearing 66 to allow the disk 70 to move downwardly by virtue of the spring tension of spring 92 pulling the frame 38 downwardly. When the tool 24 reaches the work 20, it is cantilevered backwardly on a rotational axis provided by the bearing 40. This causes the transducer mounting 30 to pivot in a manner whereby an underlying tensioned arm 130 moves downwardly in the direction of arrow C off of a stop 132 formed on the arm 38. This downward movement is such that it accommodates a light pressure against the work 20 on the part of the tool 24.

The loading on the tool 24 is enhanced by means of a spring 136 which is attached to the arm 130. The spring 136 pulls the arm 130 upwardly in the direction opposite from arrow C. Tension on the spring 136 is applied by means of a knurled screw 138 passing through an adjustment arm support 140 that receives the threads 142 of the knurled threaded screw 138.

The bracket or screw mount 140 is held on the arm 38 by means of screws 144.

As can be seen from the foregoing, the spring which passes through the arm 38 applies an upward tension so a loading can take place on the tool 24 by its upward tension against arm 130 which levers the mounting 30 in a clockwise direction. In effect pivot arm 130 moves the tool cone 34 downwardly against the work around the pivot point 40 by virtue of the fact that the transducer support 30 is moved in a clockwise rotational manner.

The loading provided by the knurled screw 138 can vary. However, for proper bonding the loading can be anywhere from approximately twenty-eight grams to one thousand grams of load on the work 20 that is to be bonded.

Each step of the motor 118 with regard to each of the two hundred pulses, causes the tool 24 to move approximately one mil.

In order to cause the transducer 28 to provide an ultrasonic bonding mode, a steady voltage to the transducer is applied. This is applied by means of a generator in the form of generator 150. Generator 150 is connected to the transducer and provides a voltage that is preset by means of a control microprocessor 152. The control microprocessor 152 is adjusted to provide the amount of voltage necessary to cause the ultrasonic vibration of the transducer 28 in accordance with the size of the bond that is in some measure dictated by the wire size.

The generator 150 has an eight bit parallel input port. If all the bits are high, the maximum voltage is applied and if they are all low, no voltage is applied.

The microprocessor 152 can put out a variably desired bit pattern to the generator 150 to provide two hundred and fifty six discrete levels of output as to voltage which is then provided to the transducer on the line 154.

The output of the generator 150 is phase locked to the transducer 28 by means of a phase locked loop. The phase locked loop allows for fine tuning and holds the relationship between the voltage and the current.

Current flows from the generator 150 through the transducer 28 and then through a current resistor 158 on line 160.

The voltage across resistor 158 is also used to provide amplitude detection.

The output of the control microprocessor 152 on line 164 is connected to the generator input ports. The processor 152 is initially triggered by a start and stop switch 166 that controls the entire system through the microprocessor.

By way of a block diagram explanation, the control microprocessor 152 is provided with a signal for stopping it from a comparator circuit 170. The comparator circuit is in turn connected to an envelope detector 172. The envelope detector 172 determines the drop in amplitude of the voltage in the form of a full amplitude wave form, shown as full amplitude wave form 176 that then diminishes to a wave form 178 of the same frequency when the transducer 28 is dampened. This is caused by the tool 24 touching the work 20. At the threshold or crossover point 180 where the full amplitude wave 176 is decreased to the lesser amplitude 178, the detector 172 determines that a drop in voltage has occurred. This drop in voltage from level 184 to voltage level 186 with respect to a ground 188 is sensed by the envelope detector 172.

This drop in voltage level crosses through the reference voltage 190 determined by a variable resistor 192. Thus, the envelope detector 172 puts out a signal to the comparator 170 which compares the reference voltage to the dropped voltage and stops the microprocessor 152 from driving the motor 118 driven by the motor drive 200. The foregoing stops the motor 118 and tool 24 at the point of touchdown against the work 20.

In effect, the transducer 28 when it is dampened, causes an increased impedance, thereby causing a drop in voltage from the full amplitude wave form 176 to the lesser wave form 178 as to its full amplitude. This causes a crossover of voltage from the higher voltage 184 to the lower voltage 186 through the reference voltage 190. The envelope detector 172 then provides a voltage to the comparator that is compared to the voltage on reference voltage resistor 192 so that the control microprocessor 152 is signalled that a crossover or increased impedance has taken place that is tantamount to the touchdown. The control microprocessor 152 driving the motor drive then causes the motor drive to stop.

Looking more particularly at the details of the circuit, it can be seen that a voltage limiter in the form of a resistor 202 and diodes 204 and 206 are seen. This voltage limiting circuit is connected to the signal sample that is received across resistor 158. The shunt diodes 204 and 206 will short out and prevent inputs from high level voltages and at the same time allow the system to function.

A summing resistor 208 is connected to the input of an Op amp 210 at its minus side. The Op amp is an active diode detector. The Op amp incorporates a feedback resistor connected thereto in the form of resistor 212 and active diodes 214 and 216.

Diode 216 is a rectifier diode, while diode 214 is a clamp diode.

Two resistors 220 and 222 are summing resistors for a second Op amp 224. A resistor 226 performs a current to voltage conversion in combination with a filter capacitor 230 that fundamentally provides a DC wave form.

Resistor 226 is a feedback resistor to the summing junction of the Op amp 227.

The output of the Op amp 224 is through a low pass filter comprising a resistor 240 and a capacitor 242. This combination provides a low pass filter for the remaining portion of the circuit which in effect is the comparator portion.

The comparator circuit is of a digital nature and turns from an on to an off mode through the gate 246, which can be generally referred to as the comparator. Resistors 248 and 250 which is a variable resistor, form a voltage divider network for the comparator 246. Thus, the reference input to the comparator 246 is resistors 248 and 250 in combination with each other.

A resistor 254 provides a positive feedback for the circuit and at the same time noise immunity in some measure. A resistor 256 is connected at the output to provide a pullup function for the circuit.

The foregoing generally sets forth the mechanical functions of the device, as well as the circuitry and block diagram elements. In essence, the transducer 28 when dampened by the tool 24 being placed in contact with the work 20, creates an increased impedance. This increased impedance is read as a decreased voltage by the envelope detector 172 with respect to the reference voltage provided by resistor 192. The output of the envelope detector 172 to the comparator 170 with respect to the reference voltage then signals the control microprocessor 152 to stop the motor 118.

The pulsing to the motor 118 provided by the control microprocessor is so discrete, that the contact by the tool 24 is fundamentally stopped in a very short time. Furthermore, the incremental decrease of the slope on surface 104 of the cam 100 is such that the tool 24 is decelerating at a very slow rate. By stopping the pulses to the motor 118 as the revolution of the cam takes place, it stops the tool 24 quickly and provides for a non-jolting type of contact by the tool against the work 20. This, of course, provides the improved bonding as previously described in the description of the prior art.

From the foregoing, it should be seen that this invention is a substantial step in improving ultrasonic bonding and should be read broadly in light of the following claims.

We claim:

1. An ultrasonic bonding device comprising an ultrasonic bonder having a transducer that is connected to a tool for ultrasonic bonding or welding that is in turn driven by a generator at a specific voltage to provide ultrasonic vibrations for welding with a support for said tool that moves upwardly and downwardly driven by a motor wherein the improvement comprises:
    means for detecting increased impedance when the tool makes contact with a work surface by virtue of the fact that the transducer is dampened; and,
    means for stopping the motor when such impedance is increased which is tantamount to touchdown.

2. The ultrasonic welding device as claimed in claim 1 wherein:
    increased impedance and attendant touchdown of the tool is detected by means of detecting a decrease in voltage.

3. The device as claimed in claim 2 further comprising:
    means for establishing a reference voltage for determining when the voltage of said transducer is decreased beyond a particular reference voltage level.

4. The device as claimed in claim 3 further comprising:
    an envelope detector for determining when voltage drops from a pre-established level to below said reference voltage established by said reference voltage means.

5. The device as claimed in claim 4 further comprising:
    a comparator for comparing the reference voltage to the drop in voltage determined by said envelope detector.

6. The device as claimed in claim 5 further comprising:
    a microprocessor for controlling the motor drive; and,
    means for causing said microprocessor to stop the motor drive when a signal from said comparator is applied to the motor drive from said control processor.

7. The device as claimed in claim 6 wherein:
    said envelope detector comprises at least one Op amp to provide a signal to said comparator.

8. The device as claimed in claim 7 further comprising:
    a diode connected to the Op amp for purposes of causing said Op amp to form the function of an active diode detector.

9. The device as claimed in claim 8 further comprising:
    a comparator circuit formed as a gate having its input connected to the output of said Op amp.

10. An ultrasonic bonding touchdown sensing circuit in combination with a motor driven ultrasonic bonding device comprising:
    an ultrasonic bonding device for bonding one material to another material having an electrical to mechanical transducer which can be mvoed by the motor in relationship to the materials to be bonded;
    means for electrically driving said transducer in the form of a generator;

means for detecting an increased impedance within said transducer of said ultrasonic bonding device when its mechanical movement is dampened by contact with a surface to which a bond is to take place;

a voltage reference that can be established with respect to the voltage of said transducer;

a motor drive for driving a motor of said ultrasonic bonding device for movement thereof with respect to the materials to be bonded; and, a comparator for stopping said motor drive when the voltage decreases beyond the reference voltage.

11. The circuit as claimed in claim 1 further comprising:

an envelope detector for purposes of detecting the fall of the voltage based upon its amplitude which is connected to said comparator.

12. The circuit as claimed in claim 11 further comprising:

a control microprocessor for controlling the generator to said transducer and the motor drive.

13. The circuit as claimed in claim 12 wherein:

said envelope detector comprises at least one Op amp for purposes of making a determination as to decreases in voltage.

14. The circuit as claimed in claim 13 wherein said comparator comprises:

at least one gate for purposes of comparing a reference voltage to the voltage read from said generator to said transducer.

15. The circuit as claimed in claim 14 wherein said circuit comprises:

an Op amp that forms an active diode detector with diodes connected thereto.

16. An ultrasonic welding device comprising:

a transducer connected to a transducer support having a tool for ultrasonic bonding connected to said transducer;

cam means for raising and lowering said transducer support;

a stepping motor for driving said cam and connected to said cam for rotational movement thereof to provide upward or downward movement of said transducer support;

a generator for powering said transducer;

means for detecting increased impedance of said transducer when the tool to which it is connected makes contact; and, means for electronically stopping said motor when the increased impedance is detected.

17. The ultrasonic welding device as claimed in claim 16 further comprising:

pivotal support means upon which said transducer support rests.

18. The ultrasonic welding device as claimed in claim 17 further comprising:

an envelope detector for determining changes in voltage to correspond to increased impedance when said transducer is dampened by the tool touching a piece of work to be welded so as to provide a signal to said motor for stopping said motor.

19. The ultrasonic welding device as claimed in claim 18 further comprising:

means for establishing a reference voltage with respect to voltage applied to said transducer.

20. The ultrasonic welding device as claimed in claim 19 further comprising:

a comparator for comparing the reference voltage established by said means for establishing said reference voltage and the output of said envelope detector so as to provide a signal to said motor drive for stopping said motor which moves said cam.

21. The device as claimed in claim 20 further comprising:

a microprocessor for controlling said motor drive by pulses supplied to said motor drive; and, wherein, said microprocessor is connected to said comparator so that the output of said comparator can signal said microprocessor to stop pulses to said motor drive.

22. The ultrasonic welding device as claimed in claim 21 further comprising:

means connected to said control microprocessor for controlling the output of said generator to establish the level of voltage which is being put out by said generator.

23. The ultrasonic welding device as claimed in claim 22 further comprising:

at least one Op amp forming said envelope detector circuit; and, diodes connected to said Op amp for providing an active diode detector.

24. The ultrasonic welding device as claimed in claim 23 further comprising:

a comparator formed as a gate receiving a signal from said envelope detector to provide an output therefrom which corresponds with the signal from said envelope detector for purposes of signalling said control microprocessor that decreased voltage has been detected by said envelope detector with regard to the reference voltage, thereby signalling touchdown of said welding tool.

* * * * *